(12) United States Patent
Joshi et al.

(10) Patent No.: US 10,256,097 B2
(45) Date of Patent: Apr. 9, 2019

(54) FORMING A METAL CONTACT LAYER ON SILICON CARBIDE AND SEMICONDUCTOR DEVICE WITH METAL CONTACT STRUCTURE

(71) Applicant: Infineon Technologies AG, Neubiberg (DE)

(72) Inventors: Ravi Keshav Joshi, Klagenfurt (AT); Romain Esteve, Munich (DE); Roland Rupp, Lauf (DE); Francisco Javier Santos Rodriguez, Villach (AT); Gerald Unegg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/846,591

(22) Filed: Dec. 19, 2017

(65) Prior Publication Data

US 2018/0174840 A1 Jun. 21, 2018

(30) Foreign Application Priority Data

Dec. 20, 2016 (DE) .................. 10 2016 125 030

(51) Int. Cl.
*H01L 21/04* (2006.01)
*H01L 29/06* (2006.01)
(Continued)

(52) U.S. Cl.
CPC ...... *H01L 21/0485* (2013.01); *H01L 29/0688* (2013.01); *H01L 29/0692* (2013.01); *H01L 29/0813* (2013.01); *H01L 29/1095* (2013.01); *H01L 29/41708* (2013.01); *H01L 29/42304* (2013.01); *H01L 29/45* (2013.01); *H01L 29/66068* (2013.01); *H01L 29/732* (2013.01); *H01L 29/8083* (2013.01); *H01L 29/8611* (2013.01); *H01L 29/0878* (2013.01); *H01L 29/1075* (2013.01); *H01L 29/1608* (2013.01); *H01L 29/6606* (2013.01); *H01L 29/7395* (2013.01); *H01L 29/7805* (2013.01);
(Continued)

(58) Field of Classification Search
CPC ............ H01L 29/7805; H01L 29/0878; H01L 29/0688; H01L 29/0692; H01L 29/0813; H01L 29/1095; H01L 29/41708; H01L 29/42304; H01L 29/45; H01L 29/66068; H01L 29/732; H01L 29/8083; H01L 29/8611; H01L 21/0485; H01L 2924/0002
USPC .......................................................... 257/77
See application file for complete search history.

(56) References Cited

U.S. PATENT DOCUMENTS

2013/0341647 A1 12/2013 Yamada et al.
2016/0043034 A1 2/2016 Joshi

FOREIGN PATENT DOCUMENTS

DE 102006050360 A1 5/2008
DE 102015100665 A1 7/2015
(Continued)

*Primary Examiner* — Allen L Parker
*Assistant Examiner* — Patricia D Reddington
(74) *Attorney, Agent, or Firm* — Murphy, Bilak & Homiller, PLLC

(57) ABSTRACT

A semiconductor device includes a silicon carbide semiconductor body and a metal contact structure. Interface particles including a silicide kernel and a carbon cover on a surface of the silicide kernel are formed directly between the silicon carbide semiconductor body and the metal contact structure. Between neighboring ones of the interface particles, the metal contact structure directly adjoins the silicon carbide semiconductor body.

15 Claims, 15 Drawing Sheets

(51) Int. Cl.
*H01L 29/10* (2006.01)
*H01L 29/45* (2006.01)
*H01L 29/66* (2006.01)
*H01L 29/732* (2006.01)
*H01L 29/808* (2006.01)
*H01L 29/861* (2006.01)
*H01L 29/417* (2006.01)
*H01L 29/423* (2006.01)
*H01L 29/08* (2006.01)
H01L 29/78 (2006.01)
H01L 29/16 (2006.01)
H01L 29/739 (2006.01)

(52) U.S. Cl.
CPC ........ *H01L 29/7813* (2013.01); *H01L 29/861* (2013.01); *H01L 2924/0002* (2013.01)

(56) References Cited

FOREIGN PATENT DOCUMENTS

| | | |
|---|---|---|
| JP | H07211896 A | 8/1995 |
| JP | 2010056437 A | 3/2010 |
| JP | 2011054698 A | 3/2011 |
| JP | 2016009695 A | 1/2016 |
| JP | 2016058657 A | 4/2016 |
| WO | 2013021786 A1 | 2/2013 |
| WO | 2015076128 A1 | 5/2015 |

US 10,256,097 B2

FORMING A METAL CONTACT LAYER ON SILICON CARBIDE AND SEMICONDUCTOR DEVICE WITH METAL CONTACT STRUCTURE

BACKGROUND

Semiconductor devices based on silicon carbide (SiC) benefit from the wide bandgap, high breakdown electric field, high thermal conductivity, chemical inertness and mechanical hardness of silicon carbide. One of the hurdles that impede to some degree the wide-scale introduction of SiC devices is the metallurgic interface between SiC and metals, which is more complex than that between metal and other semiconductor materials and which is part of ohmic contacts to SiC. Ohmic contacts provide unimpeded flow of charge carriers to and from doped regions in a semiconductor body to a metal terminal, when a bias voltage is applied across the ohmic contact. An ohmic contact is typically defined as an interface which has a linear and symmetric current voltage relationship at least within the limits of its intended use. Ohmic contacts to doped regions in silicon carbide are typically based on a metal silicide. Quality and stability of silicide contacts strongly depend on the process conditions under which the silicide contact is formed, on doping level and dopant type in the doped silicon carbide region, surface roughness, the polytype of the silicon carbide lattice and on whether the contact surface of the silicon carbide region is formed from silicon atoms (Si-face) or carbon atoms (C-face).

There is a need for a cost-competitive, reliable and easily applicable ohmic contact for silicon carbide devices.

SUMMARY

The present disclosure concerns a method of manufacturing a semiconductor device, wherein the method includes forming a starting layer from a material, which contains a silicide-forming metal, on a process surface of a silicon carbide body. From the starting layer and a portion of the silicon carbide body, interface particles are formed, which include a silicide kernel and a carbon cover. Between the interface particles, a contact portion of the process surface is exposed. A metal contact layer is formed directly on the contact portion of the process surface, wherein the interface particles are embedded between the metal contact layer and the silicon carbide body.

The present disclosure further concerns a semiconductor device that includes a silicon carbide semiconductor body and a metal contact structure. Interface particles including a silicide kernel and a carbon cover on a surface of the silicide kernel are directly between the silicon carbide semiconductor body and the metal contact structure. Between neighboring ones of the interface particles the metal contact structure directly adjoins to the silicon carbide semiconductor body.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
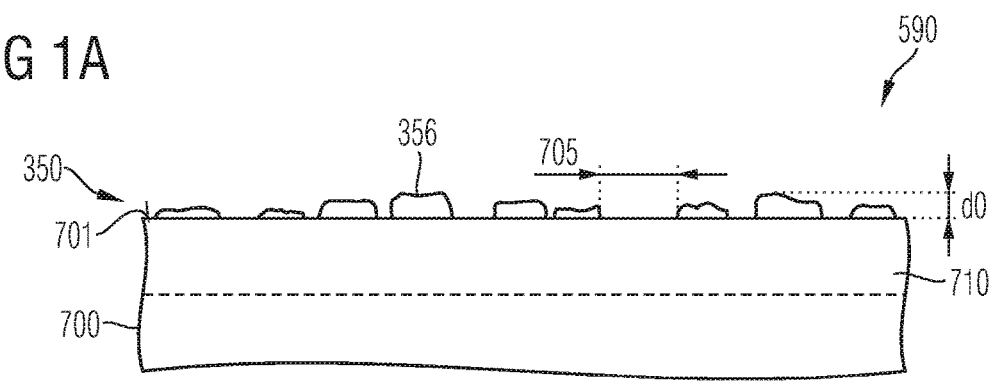
FIG. 1A is a schematic vertical cross-sectional view of a portion of a silicon carbide substrate for illustrating a method of manufacturing a semiconductor device with a contact structure including interface particles with a silicide kernel according to an embodiment, after forming an incomplete starting layer on a silicon carbide body.
Figure 1B:
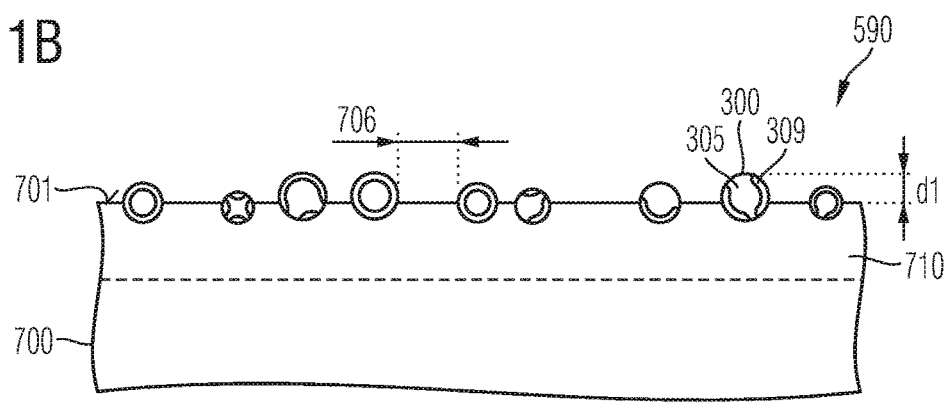
FIG. 1B is a schematic vertical cross-sectional view of the silicon carbide substrate portion of FIG. 1A, after forming interface particles.
Figure 1C:
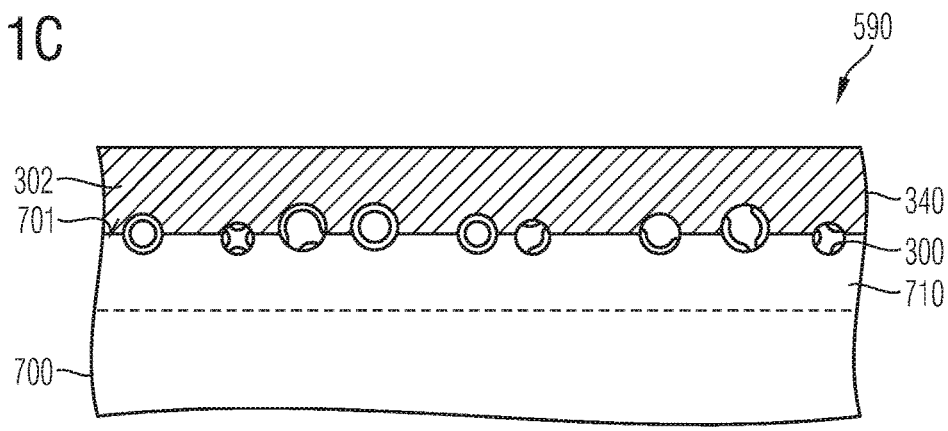
FIG. 1C is a schematic vertical cross-sectional view of the silicon carbide substrate portion of FIG. 1B, after forming a metal contact layer covering the interface particles and directly adjoining the silicon carbide body between the interface particles.

FIGS. 1A to 1C concern the formation of a contact structure forming an ohmic contact between a doped contact region 710 in a single-crystalline silicon carbide body 700 and a metal contact layer 340 for a silicon carbide substrate 590.

The silicon carbide substrate 590 may be a pre-preprocessed SiC wafer with a silicon carbide body 700 from, for example, 2H—SiC (SiC of the 2H polytype), 6H—SiC or 15R—SiC. According to an embodiment, the silicon carbide has the 4H-polytype (4H—SiC). The silicon carbide substrate 590 may include further conductive and/or insulating structures outside of or extending into the silicon carbide body 700.

The silicon carbide body 700 has a process surface 701 at a first side and a support surface on an opposite, second side. In FIG. 1A and all following Figures, the process surface 701 may be planar or may be staggered with first surface sections formed by first main crystal planes and second surface sections formed by second main crystal planes, tilted to the first surface sections and connecting neighboring first surface sections.

A normal to a planar process surface 701 or a mean plane of a staggered process surface 701 defines a vertical direction and directions in the plane of a planar process surface 701 or in the main plane of a staggered process surface 701 are horizontal directions.

The contact region 710 directly adjoins to a portion of the process surface 701 and may form a pn junction with an oppositely doped region in the silicon carbide body 700 or a unipolar junction with a further doped region of the same conductivity type. The contact region 710 may be p-type or n-type with a dopant concentration of at least $1E17\ cm^{-3}$, for example, in a range from $1E17\ cm^{-3}$ to $1E20\ cm^{-3}$.

A starting layer 350, which contains a silicide-forming metal, is formed on the process surface 701. Formation of the starting layer 350 may include application of a precursor structure including a matrix material that embeds metal particles and then removing the matrix material to set free the metal particles, which deposit on the process surface 701. According to another embodiment, forming the starting layer 350 may include applying a solution containing a metal-organic compound as a solute and then at least partly removing the solvent.

FIG. 1A shows the starting layer 350, which may be complete in the sense that the starting layer 350 completely covers the process surface 701 or which may be incomplete in the sense that the starting layer 350 does not completely cover the section of the process surface 701 formed by the contact region 710 and leaves exposed an uncoated portion.

At least in case of a complete starting layer 350, the material and structure of the starting layer 350 are selected such that the starting layer 350 tears apart or gets perforated in the course of further processing, e.g., when subjecting the silicon carbide body 700 to a heat treatment for forming a silicide. For example, the starting layer 350 may be a thin amorphous or nanocrystalline layer or a thin layer from or containing nanoparticles, e.g., nano rods or nano tubes. The heat treatment may to some degree densify, agglomerate and/or reallocate the material of the starting layer 350 such that during the heat treatment a contact portion 706 of the process surface 701 gets exposed.

In case of an incomplete starting layer 350 one or more openings 705 perforate the starting layer 350 which in this way leaves at least 5%, for example, at least 10% or 20% of the process surface 701 exposed.

An incomplete starting layer 350 may be continuous, wherein the starting layer 350 is a one-piece layer with a plurality of openings 705 perforating the starting layer 350 and exposing a plurality of separated uncoated portion of the process surface 701. The openings 705 may have the same cross-sectional area or may have different cross-sectional areas, may have the same shape or may have different shapes and may be arranged regularly or irregularly.

According to another embodiment an incomplete starting layer 350 may include a plurality of isolated sections 356, wherein one single opening 705 exposes a continuous uncoated portion of the process surface 701, wherein the continuous uncoated portion separates the isolated sections 356 of the starting layer 350 from each other. The isolated sections 356 may have the same cross-sectional area or may have different cross-sectional areas, may have the same shape or may have different shapes and may be arranged regularly or irregularly.

An incomplete starting layer 350 may be a hybrid of both embodiments and may include both sections with a plurality of openings 705 and sections with a plurality of isolated sections 356, respectively.

The silicide-forming metal in the starting layer 350 may be any metal that forms a silicide on a silicon carbide base and that has less carbon solubility. For example, the silicide-forming metal may be at least one of cobalt (Co), tungsten (W), tantalum (Ta), titanium (Ti), Chromium (Cr), molybdenum (Mo) and zirconium (Zr). According to an embodiment the silicide forming metal is or includes nickel (Ni). The starting layer 350 may contain the silicide-forming metal in elementary form or as a component of a compound, e.g., as a metal oxide.

The starting layer 350 may be amorphous or nanocrystalline in nature, wherein single grains or cluster of grains may form the isolated sections 356. According to another embodiment, the starting layer 350 may be from or may contain nanoparticles, e.g., nano rods or nano tubes. A maximum vertical extension d0 of the starting layer 350 may be in a range from 2 nm to 1 µm, for example, in a range from 5 nm to 500 nm.

A heat treatment of the starting layer 350 and an adjoining portion of the silicon carbide body 700 releases silicon from the silicon carbide lattice, wherein the released silicon and the silicide-forming metal of the starting layer 350 form isolated silicide kernels 305. The remaining carbon set free from the silicon carbide lattice by absorption of the silicon atoms in the silicide kernels 305 segregates in sp2 hybridized form and accumulates at the surface of the silicide kernels 305. Silicidation and segregation of carbon only takes place directly below and along sections of the starting layer 350.

The heat treatment may include a laser anneal selectively heating the portions of the silicon carbide substrate 590 exposed to the laser beam to temperatures in a range from 500° C. to 1500° C. The duration of the heat treatment depends on the applied temperature and may range from about 1 minute for a heat treatment at 1500° C. to about 60 minutes for a heat treatment at 500° C.

FIG. 1B shows interface particles 300 formed along the process surface 701 from the silicide kernels 305 and from the excess carbon. The silicide kernels 305 are almost completely free from carbon since carbon segregates out of silicide. The excess carbon accumulates on the exposed surface of the silicide kernels 305 and at the interface to the silicon carbide body 700 and forms a carbon cover 309 that may form a shell completely or only partially embedding the silicide kernel 305. The carbon cover 309 may be non-continuous or continuous or may be formed by separated agglomerations of sp2 hybridized carbon. In such sections of the process surface 701, which are not covered by an incomplete starting layer 350 or which get exposed during the heat treatment, no silicidation takes place, the SiC lattice remains undamaged, and no or almost no carbon segregates.

The interface particles 300 are partially buried in the contact region 710 and may partially protrude from the process surface 701. The interface particles 300 may be flakes, grains, flat structures or may be partially or completely spherical.

The silicide may be nickel silicide containing an $Ni_2Si$ phase, cobalt silicide containing a cobaltdisilicide ($CoSi_2$) phase, tungsten silicide containing a tungstendisilcide ($WSi_2$) phase, tantalum silicide containing a tantalumdisilicide ($TaSi_2$) phase, titanium silicide containing a titaniumdisilicide ($TiSi_2$) phase, chromium silicide containing a chromiumdisilicide ($CrSi_2$) phase, molybdenum silicide containing a molybdenumdisilicide ($MoSi_2$) phase and/or zirconium silicide containing a zirconiumdisilicide ($ZrSi_2$) phase.

The interface particles 300 and/or agglomerations of the interface particles 300 are at least partially separated from each other in the horizontal direction, such that between the interface particles 300 or between agglomerations of interface particles 300 a connection portion 706 of the process surface 701 is exposed. The connection portion 706 may widely correspond to the uncoated portion exposed by the opening(s) 705 shown in FIG. 1A or may be exposed only in the course of formation of the interface particles 300. An area ratio of the exposed connection portion 706 to the total area of interest may be at least 10%, for example, at least 20%.

The carbon cover 309 of the interface particles 300 may include carbon in sp2-hybridized form as a continuous or discontinuous graphite layer, wherein the continuous carbon cover 309 may encapsulate the silicide kernel 305 completely or only partially.

A metal contact layer 340 is formed on the process surface 701, e.g., by sputtering, by chemical vapor deposition or by electroplating. For example, the metal contact layer 340 may be from at least one of aluminum (Al), copper (Cu), an aluminum copper alloy (AlCu), an aluminum silicon alloy (AlSi), an aluminum silicon copper alloy (AlSiCu), tungsten (W), silver (Ag), titanium (Ti), tantalum (Ta) and vanadium (V).

FIG. 1C shows that the metal contact layer 340 is in direct contact with both the contact region 710 in the silicon carbide body 700 and with the interface particles 300. The carbon cover 309 may contribute to reducing the ohmic resistance between the metal contact layer 340 and the silicide kernels 305 and/or between the silicide kernels 305 and the silicon carbide body 700. On the other hand, the carbon-free direct interfaces between the metal contact layer 340 and the silicon carbide body 700 provide a stable and reliable mechanical connection between the metal contact layer 340 and the silicon carbide body 700.

Conventionally, forming contact structures for ohmic contacts to silicon carbide from a sputtered nickel layer completely covering a silicon carbide surface typically results in that excess carbon atoms segregated from the silicon carbide lattice accumulate along planar metallurgic interfaces extending across the complete horizontal cross-section of a contact structure and within or on top of metal contact layers, where the carbon atoms deteriorate the adhesion of the metal on the interface and weaken the mechanical stability of such contact structures. Reduced metal adhesion may result in that the metal contact layer at least partially peels off from the underlayer at thermomechanical stress. On the other hand, removal of the segregated carbon before deposition of the metal contact layer may be a complex and cost-intensive task.

By contrast, in contact structures according to the present embodiments the metal contact layer 340 directly adjoins a connection portion 706 of the process surface 701, which is completely or at least to a high degree free of any carbon deposits. The absence of carbon deposits in the connection portion 706 results in a reliable and stable mechanical connection between the metal contact layer 340 and the silicon carbide body 700. In addition, the contact structure may benefit also from the carbon cover 309 of the interface particles 300 that may contribute to a reduction of the total ohmic resistance between the contact region 710 and the metal contact layer 340.

Figure 2A:
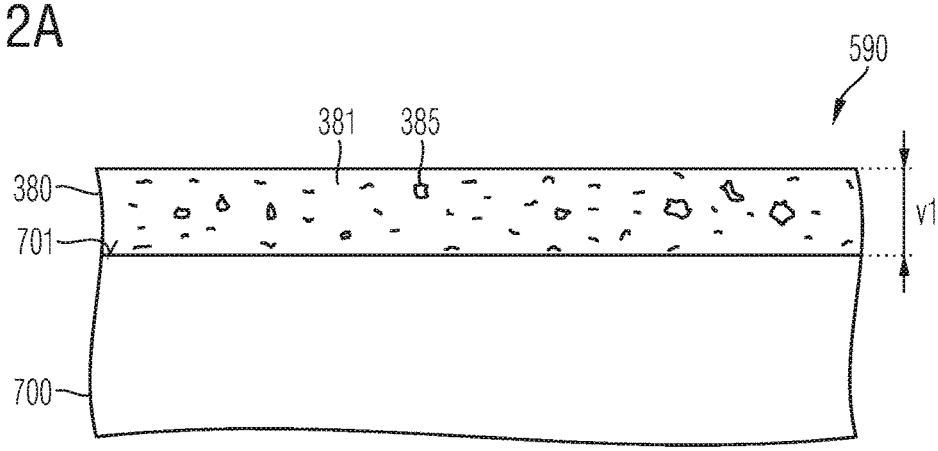
FIG. 2A is a schematic vertical cross-sectional view of a portion of a silicon carbide substrate for illustrating a method of manufacturing semiconductor devices with contact structures including interface particles according to an embodiment concerning formation of a starting layer by removing a matrix material embedding metal particles, after forming a precursor structure including the matrix material and the metal particles.
Figure 2B:
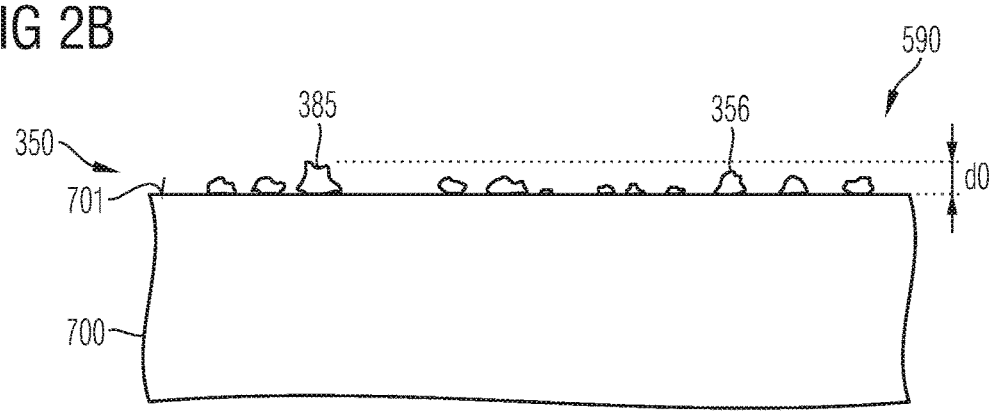
FIG. 2B is a schematic vertical cross-sectional view of the silicon carbide substrate portion of FIG. 2A, after removing the matrix material.
Figure 2C:
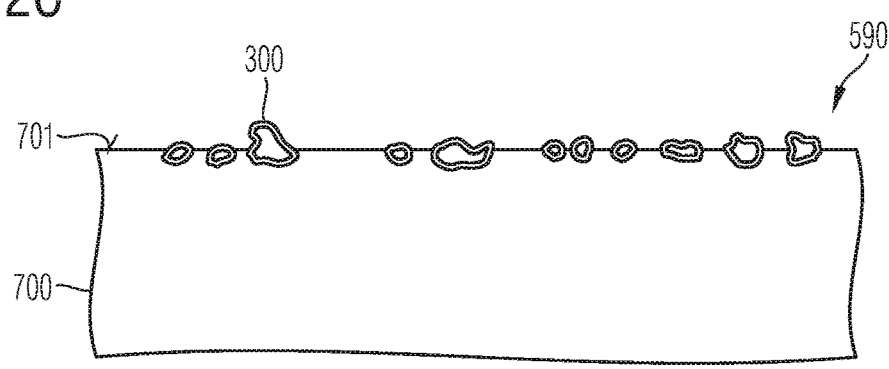
FIG. 2C is a schematic vertical cross-sectional view of the silicon carbide substrate portion of FIG. 2B, after forming the interface particles.

FIGS. 2A to 2C refer to a process forming a non-continuous starting layer 350 by a process, which may be a predominantly physical process.

A precursor structure 380, which contains a matrix material 381 and metal particles 385 embedded in or adhered to the matrix material 381, is formed on the process surface 701, e.g., by a spin-on process, by spray coating, printing, dipping, dumping or adhesive bonding.

FIG. 2A shows the precursor structure 380 on the process surface 701. The precursor structure 380 may be a suspension or slurry, wherein the matrix material 381 is a liquid in which the metal particles 385 float. According to other embodiments the matrix material 381 may be solid, e.g., a decomposable and gasifiable resin. According to a further embodiment the precursor structure 380 may include a carrier tape and an adhesive bonds the metal particles 385 to an adhesive surface of the carrier tape, wherein the adhesive surface is adhesion bonded onto the process surface 701.

The metal particles 385 may be from elementary metal or from a metal compound, for example, from a metal oxide. The metal particles 385 may be spheres, grains, and/or flakes by way of example. The volumes of the metal particles 385 may be approximately the same or may differ by at least one order of magnitude. A vertical extension v1 of the precursor structure 380 may be in a range from 100 nm to several hundred micrometers.

In case of a solid matrix material 381 the metal particles 385 may be irregularly distributed within the precursor structure 380 across the complete vertical extension v1 of the precursor structure 380 or may be arranged regularly in a predefined pattern along an adhesive surface of the precursor structure 380 parallel to the process surface 701.

The matrix material 381 may be removed. For example, in case of an adhesion-bonded carrier tape, the adhesion bonding may be partially or completely released by means of a heat treatment or by exposure to suitable radiation, e.g., ultraviolet light and the carrier tape is peeled off. According to other embodiments, a heat treatment removes the matrix material 381 to set free the metal particles 385.

FIG. 2B shows the metal particles 385 deposited on the process surface 701. The same or a further heat treatment silicidizes the metal particles 385 to form isolated interface particles 300 illustrated in FIG. 2C.

The heat treatment may be a two-stage heat treatment, wherein a first partial heat treatment vaporizes or decomposes the matrix material 381 and gasifies the decomposition products. A second partial heat treatment forms the isolated interface particles 300 from the metal particles 385 set free and deposited on the process surface 701 during the first partial heat treatment. According to another embodiment, the same heat treatment vaporizes or decomposes and gasifies the matrix material 381 and silicidizes the deposited metal particles 385. Then a metal layer may be deposited to form a contact structure as described with reference to FIG. 1C.

Figure 3A:
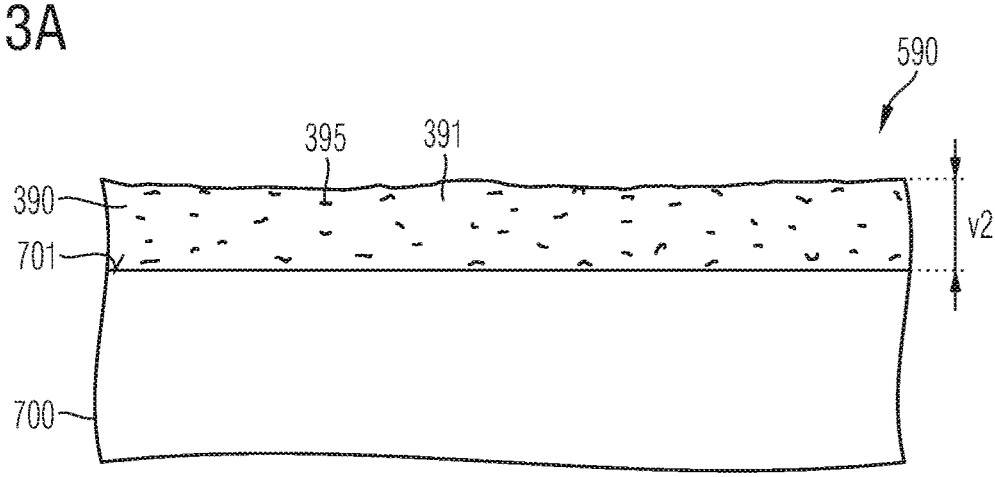
FIG. 3A is a schematic vertical cross-sectional view of a portion of a silicon carbide substrate for illustrating a method of manufacturing semiconductor devices with contact structures including interface particles according to an embodiment concerning formation of a starting layer from a solution, after applying the solution.
Figure 3B:
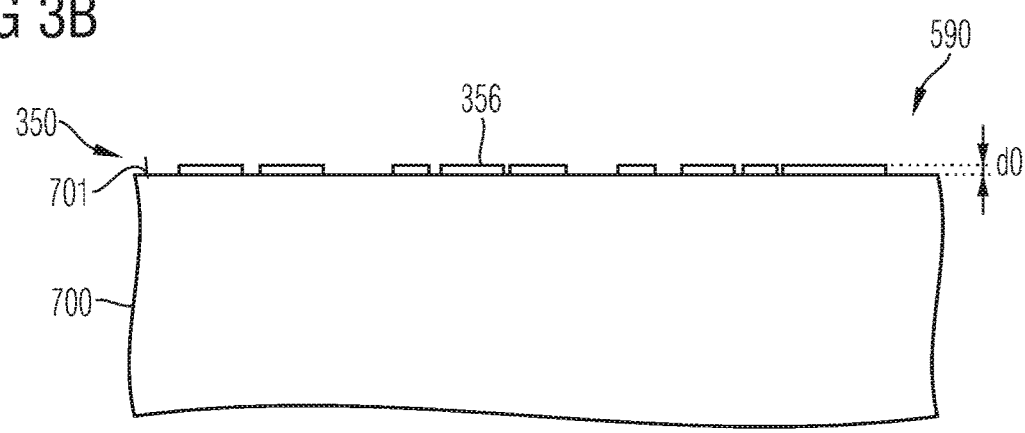
FIG. 3B is a schematic vertical cross-sectional view of the silicon carbide substrate portion of FIG. 3A, after forming the starting layer from a solute of the solution of FIG. 3A.
Figure 3C:
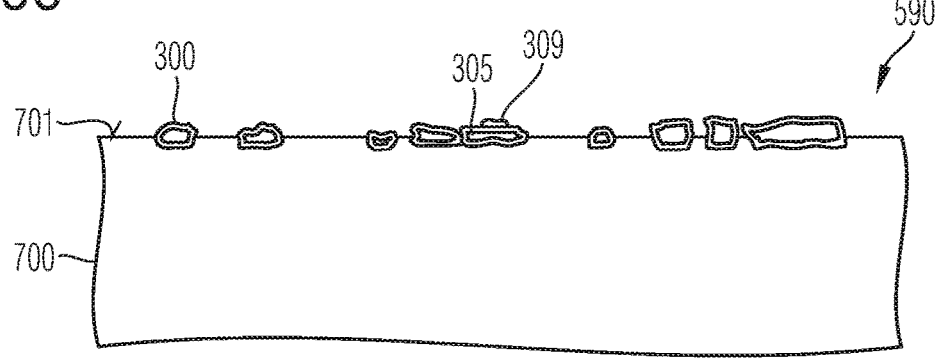
FIG. 3C is a schematic vertical cross-sectional view of the silicon carbide substrate portion of FIG. 3B, after forming the interface particles.

FIGS. 3A to 3C refer to a method that involves a chemical process for forming the non-complete starting layer 350 from a metal-organic precursor material.

A solution 390 containing a solvent 391 and a solute 395 is deposited on the process surface 701. The solvent 391 may be an organic solvent, for example, an organic polar-aprotic or organic aprotic solvent that lacks an acidic hydrogen atom. The boiling point of the solution 390 is in a range from about 50° C. to 200° C., e.g., from 60° C. to 100° C. The solvent may be, e.g., DMF (dimethylformamide), DMSO (dimethylsulfoxide), methanol, ethanol, 2-methoxyethanol, or isopropanol.

The solute 395 may be a metal complex containing a central metal atom or metal ion and at least one organic ligand. The central metal atom or ion is from a silicide-forming metal such as tungsten, vanadium, nickel, titanium, tin, zinc, cobalt or iron.

The organic ligand may be an oximate ligand, for example, 2-hydroxyiminoalkanoate or a 2-alkoxyiminoalkanoate, wherein the alkanoate may be C2-C8-alkanoate, for example, ethanoate, propanoate or butanoate. The alkoxy group may be C1-C4-alkoxy, for example, methyl or ethyl.

According to an embodiment the oximate-ligand may have a structure as illustrated in formula (1):

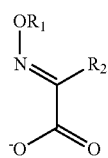

(1)

In formula (1) $R_1$ is selected from a group consisting of hydrogen and $C_1$-$C_4$-alkyle, for example, methyl or ethyl. $R_2$ is selected from a group consisting of hydrogen, $C_1$-$C_6$-alkyle, $C_6$-$C_{14}$-aryle, and $C_6$-$C_{14}$-alkylaryle. The central metal atom or ion is bound/coordinated through the nitrogen and a negative ionized oxygen ion. The number of ligands depends on the central metal atom or ion and may be two or three, by way of example. According to an embodiment, $R_2$ may be selected from methyl, ethyl, phenyl and benzyl. According to another embodiment, the ligand is a ligand according to (1), wherein both $R_1$ and $R_2$ are a methyl, e.g. methoxyiminopropanoate. A metal complex portion of the solution 390 may be in a range from 0.1 wt % to 10 wt % of the solution.

The solution 390 may be applied by spin coating, dip coating, spray coating, solution coating, inkjet printing, screen printing or pad printing, by way of example.

The solution 390 may be baked after application and before decomposition of the metal complex, for example by a heat treatment at a temperature below the temperature above which the metal complex decomposes.

FIG. 3A shows the solution 390 containing metal ions as part of a solute 395 containing oximate ligands and solved in a solvent 391.

Heat treatments decompose the metal complex to a metal compound, e.g., a metal oxide and convert the metal compound to a metal silicide. For example, a first partial heat treatment at moderate temperatures above 150° C. and below 250° C. may decompose the metal complex to form a non-complete starting layer 350 with isolated portions 356 and a second partial heat treatment forms isolated interface particles 300 from the isolated portions 356 of the non-complete starting layer 350.

According to other embodiments, a single heat treatment may form the interface particles 300 directly from the liquid or dried precursor solution 390.

According to an embodiment the solution 390 includes a solvent based on an alcohol and the metal-organic precursor includes nickel oximate. The precursor solution is spin-coated or sprayed on the process surface 701 and heat treated at about 250° C. in an inert atmosphere to decompose the nickel oximate into a non-complete and non-continuous starting layer 350 of nickel oxide. The organic part is released in form of gaseous byproducts.

FIG. 3B shows the starting layer 350, which may be amorphous or very fine nanocrystalline in nature, or a combination of both. The nickel oxide forms a sort of granulate, which forms isolated portions 356 that may completely cover the process surface 701 in the region of interest or that may leave exposed uncoated portion of the process surface 701.

A further heat treatment forms a silicide e.g., nickel silicide from the nickel oxide of the starting layer 350 and from directly adjoining portions of the silicon carbide body 700.

As shown in FIG. 3C the silicide takes the form of silicide kernels 305 only in such portions of the process surface 701, where the starting layer 350 has been present and which have not got exposed during the heat treatment.

Figure 4A:
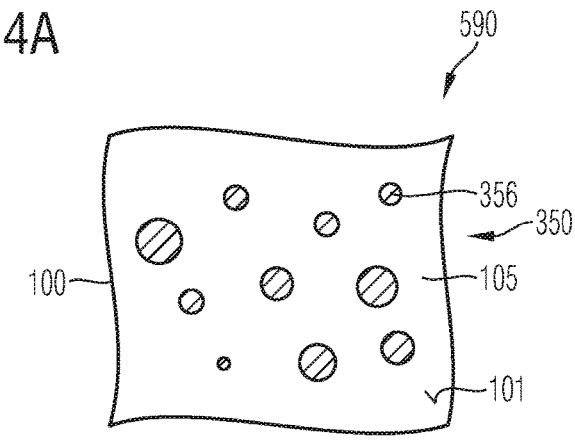
FIG. 4A is a schematic plan view of a portion of a process surface of a silicon carbide body covered with a starting layer including a plurality of irregularly distributed isolated portions according to an embodiment.
Figure 4B:
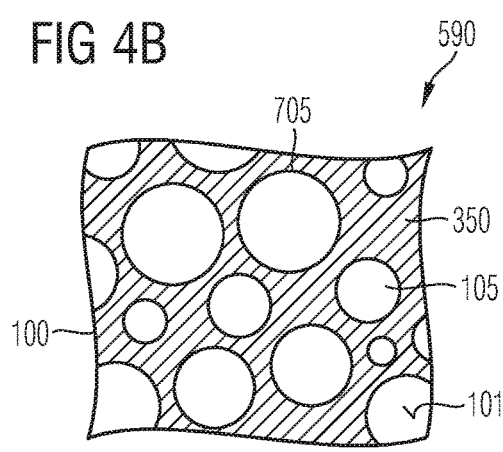
FIG. 4B is a schematic plan view of a portion of a process surface of a silicon carbide body covered with a continuous starting layer including a plurality of irregularly distributed perforations according to another embodiment.
Figure 4C:
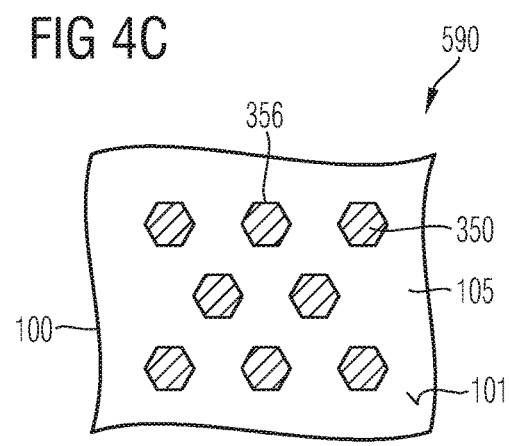
FIG. 4C is a schematic plan view of a portion of a process surface of a silicon carbide body covered with a starting layer including a plurality of regularly arranged isolated portions according to a further embodiment.

FIGS. 4A to 4C show plan views of different starting layers 350 formed by any of the above-described methods.

In FIG. 4A a non-complete starting layer 350 includes a plurality of isolated portions 356, which shape may be approximately circular. The isolated portions 356 of the starting layer 350 leave exposed a continuous, one-part uncoated portion of the process surface 701.

In FIG. 4B the non-complete starting layer 350 forms an irregular grid with isolated openings 705 that expose the uncoated portion of the process surface 701.

FIG. 4C shows regularly arranged isolated portions 356 of a starting layer 350, which may be formed, e.g., by taking up metal particles 385 with an adhesion tape, wherein the metal particles 385 may be pre-arranged by suitable means, e.g., in a mold including micro-grooves filled with the metal particles 385.

Figure 4D:
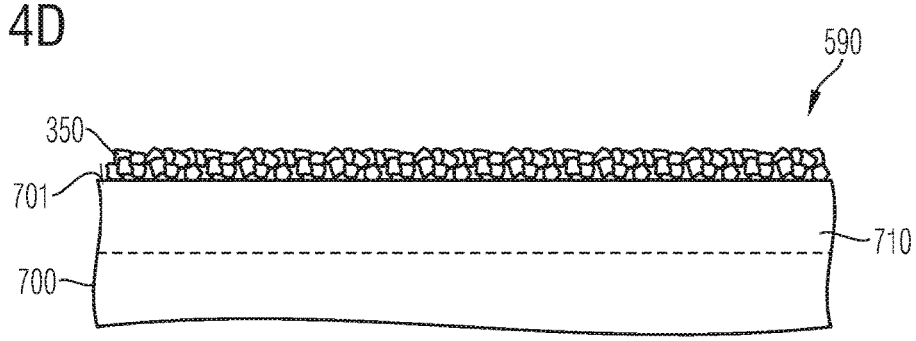
FIG. 4D is a schematic cross-sectional view of a portion of a silicon carbide body covered with a complete starting layer according to a further embodiment.

FIG. 4D shows a complete starting layer 350 including coarse-grained crystallites or nanoparticles, wherein the starting layer 350 may completely cover the process surface 701. Material, structure and thickness of the starting layer 350 are selected such that during a suitable process, e.g., a heat treatment for silicidation, the material of the starting layer 350 densifies and/or reallocates, wherein a connection portion 706 of the process surface 701 gets exposed.

Figure 5A:
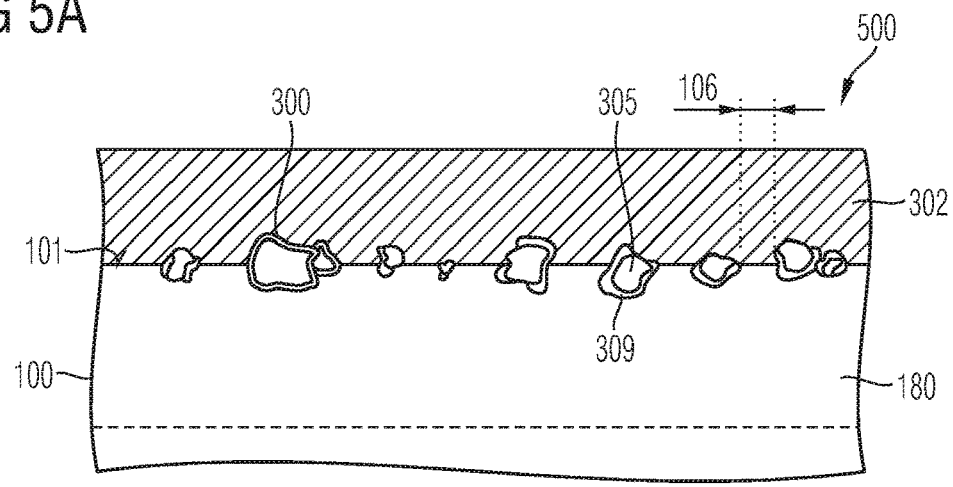
FIG. 5A is a schematic vertical cross-sectional view of a portion of a semiconductor device according to an embodiment concerning irregularly shaped interface particles.
Figure 5B:
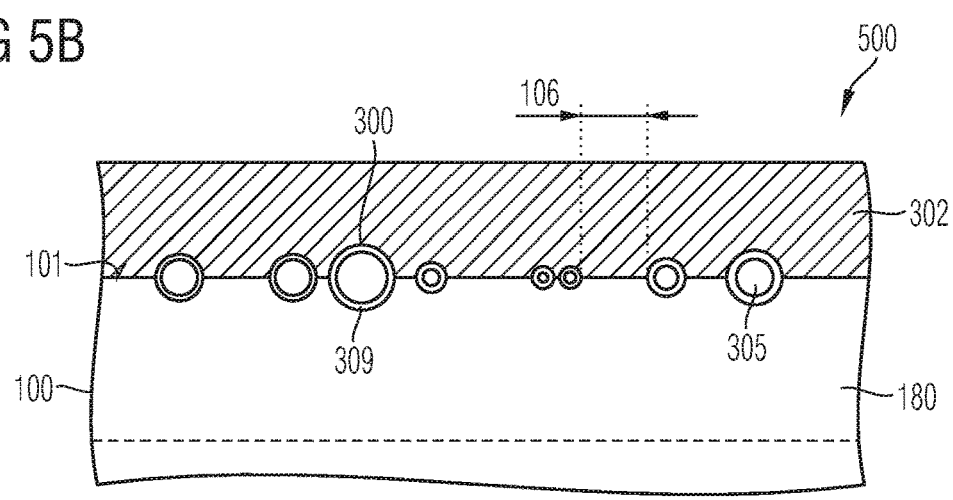
FIG. 5B is a schematic vertical cross-sectional view of a portion of a semiconductor device according to an embodiment concerning spherical interface particles.
Figure 5C:
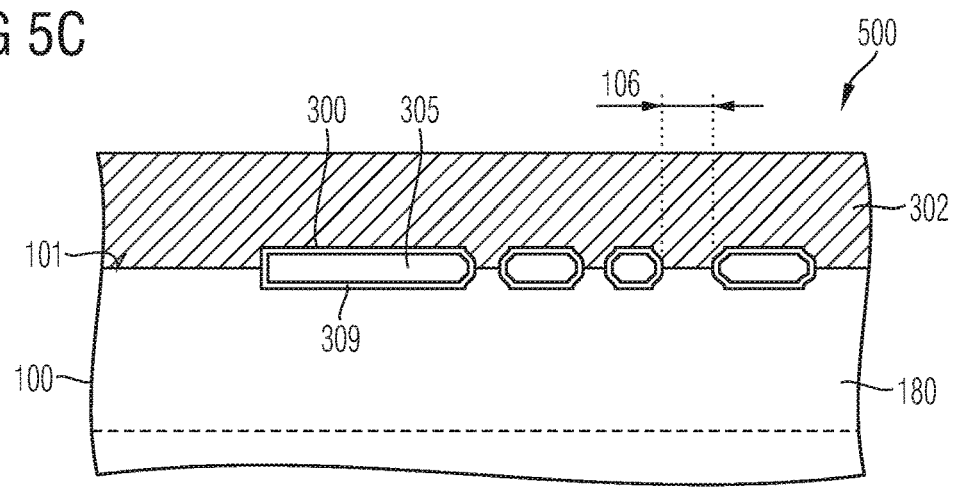
FIG. 5C is a schematic vertical cross-sectional view of a portion of a semiconductor device according to an embodiment concerning flat interface particles.

FIGS. 5A to 5C show contact structures of semiconductor devices 500, wherein the contact structures include interface particles 300 embedded at an interface between a metal contact structure 302 and a doped zone 180, which is formed in a semiconductor body 100 of silicon carbide. The interface particles 300 may protrude from a first surface 101 of the semiconductor body 100 into the metal contact structure 302 and/or may extend into the semiconductor body 100.

In FIG. 5A the interface particles 300 are irregularly shaped and differ significantly as regards the volume. The carbon covers 309 only partially envelope the silicide kernels 305. The carbon cover 309 may be absent in portions along the interface between the metal contact structure 302 and the silicide kernel 305 and along the interface between the silicide kernel 305 and the semiconductor body 100. Single interface particles 300 may be completely isolated from neighboring interface particles 300 or may form clusters or agglomerations of directly adjoining interface particles 300.

In FIG. 5B the interface particles 300 predominantly have approximately spherical shape and may differ in size.

FIG. 5C shows an example for flat interface particles 300 with different horizontal extensions and approximately identical vertical extensions.

Contact structures formed from a metal contact layer 340 and interface particles 300 as described above may be implemented in various semiconductor devices 500 including, e.g., power semiconductor diodes and power semiconductor switches such as JFETs (junction field effect transistors), IGFETs (insulated gate field effect transistors), BJTs (bipolar junction transistors) and IGBTs (insulated gate bipolar transistors).

Figure 6A:
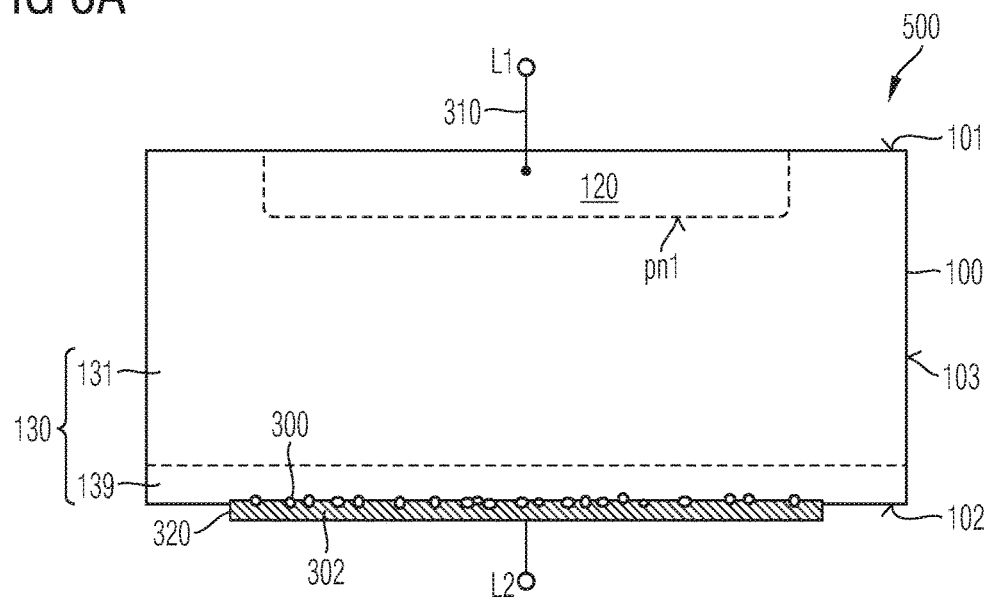
FIG. 6A is a schematic vertical cross-sectional view of a semiconductor device with a rear side metallization including interface particles according to an embodiment.
Figure 6B:
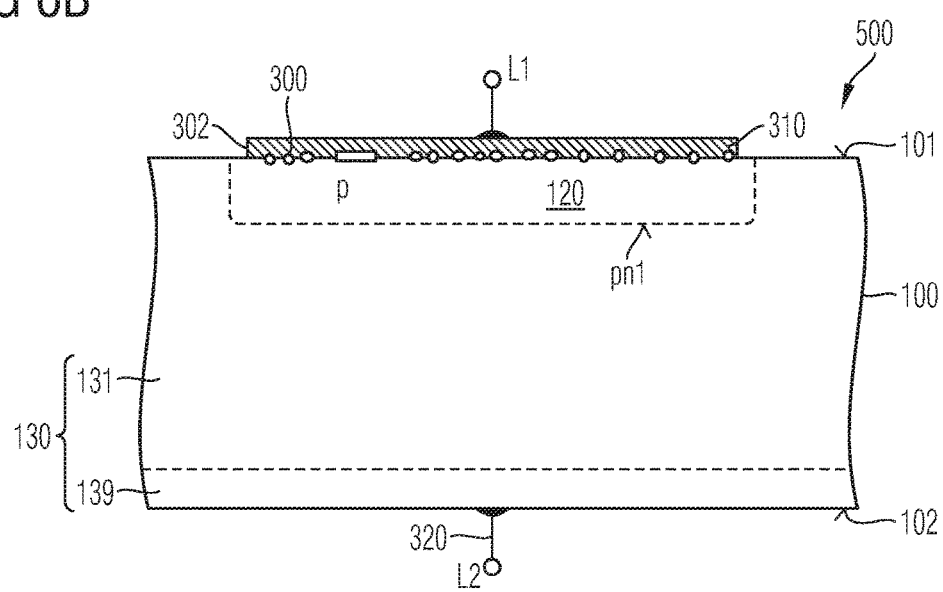
FIG. 6B is a schematic vertical cross-sectional view of a portion of a semiconductor device with a front side metallization including interface particles according to an embodiment.

FIGS. 6A and 6B refer to semiconductor devices 500 based on a semiconductor body 100 from single-crystalline silicon carbide. The semiconductor device 500 may be a power semiconductor device with a vertical on-state or forward current from the first surface 101 to the second surface 102 or vice-versa. For example, the semiconductor device 500 is a power semiconductor diode, a power semiconductor switch or an amplifier, e.g., a JFET, an IGFET, a BJT, an IGBT, a thyristor or a semiconductor device including LV (low voltage) circuits, for example, a short-circuit detection circuit or a temperature-control circuit in addition to a HV (high voltage) section including a vertical power semiconductor diode or power semiconductor switch.

The semiconductor body 100 has a planar or staggered first surface 101 at a front side and a second surface 102 on the back. Directions parallel to the first surface 101 are horizontal directions and a normal to the first surface 101 defines a vertical direction. A lateral surface 103 connects the first surface 101 and the second surface 102. The lateral surface 103 may be vertical or may include at least a vertical section directly adjoining to the first surface 101.

A horizontal cross-sectional area of the semiconductor body 100 is in a range from 0.5 mm$^2$ to 2 mm$^2$, e.g., in a range from 1 mm$^2$ to 1 cm$^2$. A vertical extension of the semiconductor body 100 may be range from 5 µm to 500 µm, for example in a range from 50 µm to 200 µm.

The semiconductor body 100 includes a doped first main structure 130 forming a first pn junction pn1 with a second main structure 120, which is formed between the first surface 101 and the first main structure 130.

The first main structure 130 includes a heavily doped contact layer 139 directly adjoining the second surface 102 and a lightly doped drift portion 131 between the heavily doped contact layer 139 and the second main structure 120.

The second main structure 120 may form, by way of example, the anode region of a power semiconductor diode, or may include the body regions of field effect or junction transistor cells electrically connected in parallel, or may include the base region of a bipolar transistor. In the latter cases, the second main structure 120 may include source zones or emitter zones formed between the first surface 101 and the body or base regions.

The second main structure 120 may be electrically connected to a first load electrode 310 at the front side. The doped contact layer 139 forms an ohmic contact with a second load electrode 320 directly adjoining the second surface 102 on the back. At least one of the ohmic contacts on the front side and on the back may include interface particles 300 embedded between a metal contact structure 302 and the semiconductor body 100.

In FIG. 6A the first load electrode 310 at the front side and electrically connected to the second main structure 120 includes a metal contact structure 302 and interface particles 300 as described above.

In FIG. 6B the second load electrode 320 on the back and electrically connected to the first main structure 130 includes a metal contact structure 302 and interface particles 300 as described above. The embodiments of FIGS. 6A and 6B may be combined.

Figure 7A:
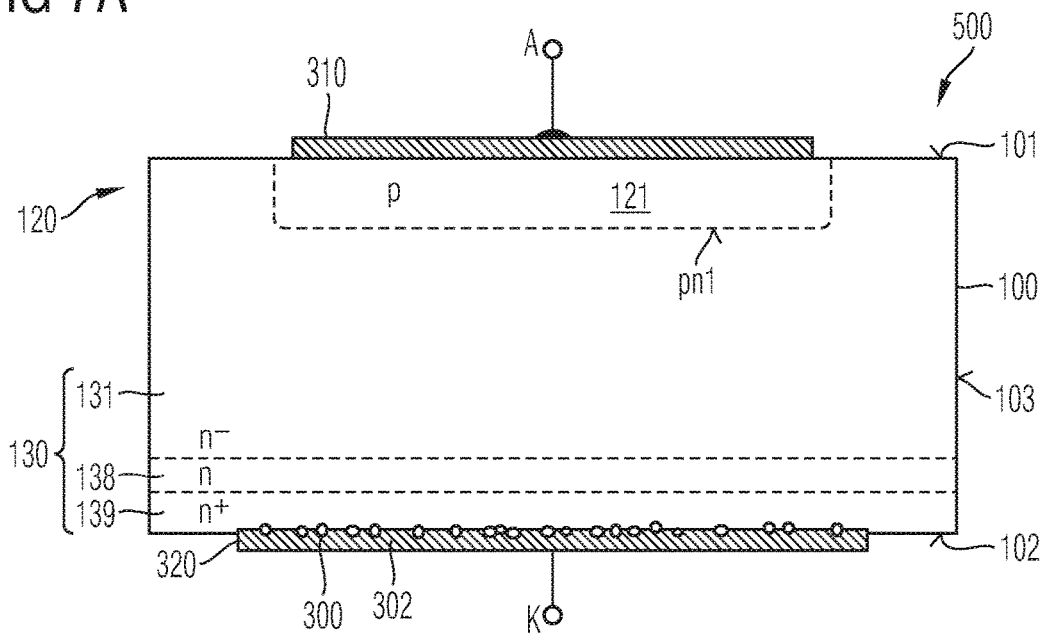
FIG. 7A is a schematic vertical cross-sectional view of a power semiconductor diode with a rear side metallization including interface particles according to an embodiment.
Figure 7B:
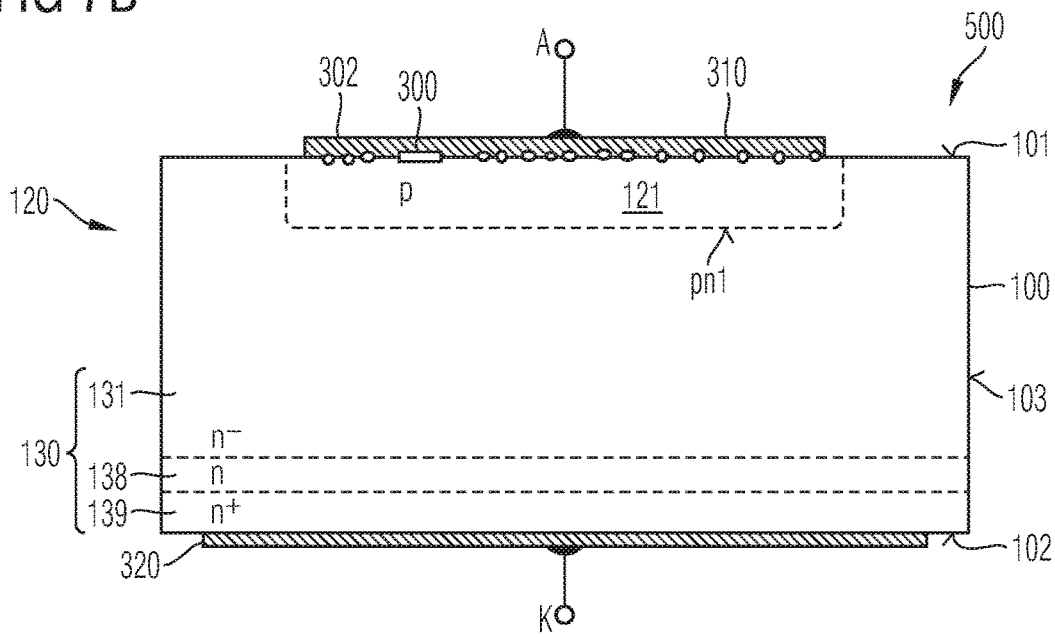
FIG. 7B is a schematic vertical cross-sectional view of a power semiconductor diode with a front side metallization including interface particles according to another embodiment.

In FIGS. 7A and 7B the semiconductor device 500 is a power semiconductor diode. The second main structure 120 includes an anode well 121 that forms a p-type anode. The contact layer 139 of the first main structure 130 forms an n-type cathode. A buffer layer 138 may be directly between (sandwiched between) between the drift portion 131 and the heavily doped contact layer 139.

A first load electrode 310 of the semiconductor diode directly adjoins the first surface 101 and may form or may be electrically connected or coupled to an anode terminal A. A second load electrode 320 that forms or that is electrically connected or coupled to a cathode terminal K directly adjoins the heavily doped contact layer 139.

In FIG. 7A the second load electrode 320 includes a metal contact structure 302 and interface particles 300 along the second surface 102.

In FIG. 7B the first load electrode 310 forms a contact structure with a metal contact structure 302 and interface particles 300 embedded at the interface between the metal contact structure 302 and the semiconductor body 100 along a portion of the first surface 101.

Figure 8:
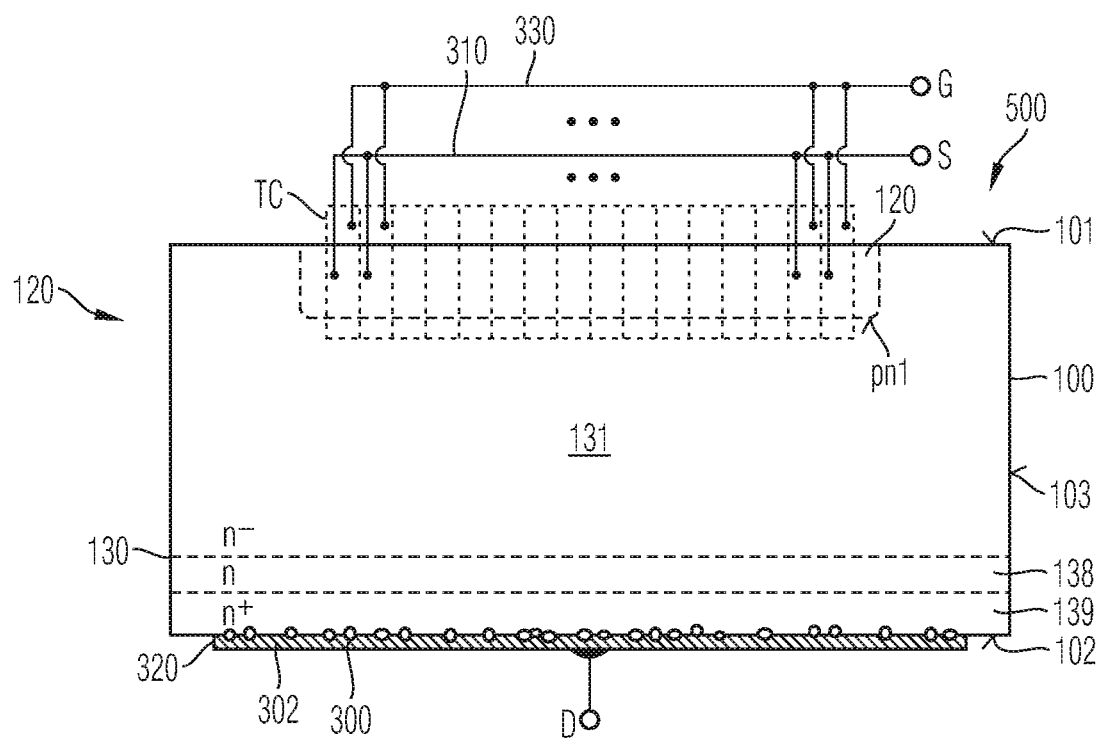
FIG. 8 is a schematic vertical cross-sectional view of an IGFET (insulated gate field effect transistor) with a rear side metallization including interface particles according to an embodiment.

In FIG. 8 the semiconductor device 500 is an IGFET including transistor cells TC electrically connected in parallel at the front side. The second main structure 120 includes the body zones of the transistor cells TC, wherein the body zones form first pn junctions with the first main structure 130 and second pn junctions with source zones which are formed between the first surface 101 and the body zones that separate the source zones from the first main structure 130.

The transistor cells TC may be planar transistor cells with controllable channels formed parallel to the first surface 101 and with gate electrodes formed on the first surface 101 or vertical transistor cells with controllable channels extending vertical to the first surface 101 and with trench gate structures, which extend from the first surface 101 into the semiconductor body 100.

The second main structure 120, which includes the body zones as well as the source zones of the transistor cells TC, is electrically connected to a first load electrode 310 which may form or which may be electrically coupled or connected to a source terminal S. Gate electrodes of the transistor cells TC are electrically connected to a control electrode 330 that forms or that may be electrically connected or coupled to a gate terminal G. A second load electrode 320 on the back may form or may be electrically connected to a drain terminal D.

The second load electrode 320 may include a metal contact structure 302 and interface particles 300 embedded between the metal contact structure 302 and the semiconductor body 100 along the second surface 102.

Figure 9:
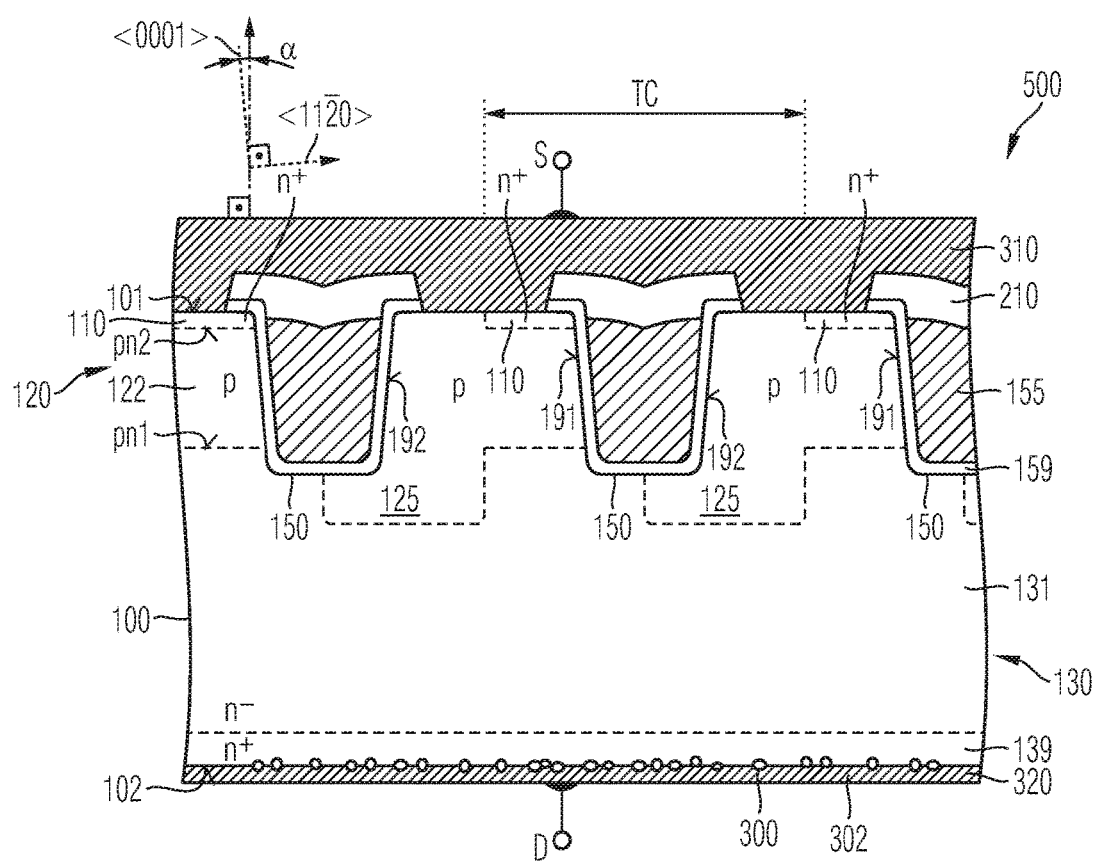
FIG. 9 is a schematic vertical cross-sectional view of an IGFET (insulated gate field effect transistor) with a rear side metallization including interface particles according to an embodiment concerning asymmetric transistor cells.

FIG. 9 shows an IGFET with a semiconductor body 100 from silicon carbide, e.g. 2H—SiC, 6H—SiC, 15R—SiC or 4H—SiC in more detail. At a front side the semiconductor body 100 has a first surface 101 which may include coplanar surface sections. The first surface 101 may coincide with a main crystal plane or may be tilted to a main crystal plane by an off-axis angle α, which absolute value may be at least 2° and at most 12°, e.g., about 4°.

In the illustrated embodiment, the <0001> crystal axis is tilted at an off-axis angle α>0 to the normal and the <11-20> crystal axis is tilted at the off-axis angle α with respect to a horizontal plane. The <1-100> crystal axis is orthogonal to the cross-sectional plane.

The first surface 101 may be serrated with parallel first surface sections shifted to each other and tilted to a horizontal plane by the off-axis angle α as well as second surface sections tilted to the first surface sections and connecting the first surface sections such that a cross-sectional line of the serrated first surface 101 approximates a saw-tooth line.

On the back of the semiconductor body 100 an opposite second surface 102 may extend parallel to the first surface 101. A distance between the first surface 101 at the front and a second surface 102 on the back is related to a nominal blocking capability of the IGFET. A total thickness of the semiconductor body 100 between the first and second surfaces 101, 102 may be in the range of several hundred nm to several hundred µm. The normal to a mean plane of the first surface 101 defines a vertical direction and directions parallel to the mean plane of the first surface 101 are horizontal directions.

The transistor cells TC are formed at the front along the first surface 101. A first main structure 130 separates the transistor cells TC from the second surface 102 on the back. The first main structure 130 may include a heavily doped contact layer 139 directly adjoining the second surface 102 and a lightly doped drift portion 131 between the transistor cells TC and the heavily doped contact layer 139.

The heavily doped contact layer 139 may be or may include a substrate portion obtained from a crystalline ingot and forms an ohmic contact with a second load electrode 320 that directly adjoins to the second surface 102. A mean dopant concentration in the heavily doped contact layer 139 is sufficiently high to ensure an ohmic contact with the second load electrode 320.

The drift portion 131 may be formed in a layer grown by epitaxy on a substrate portion including the heavily doped contact layer 139. A mean net dopant concentration in the drift portion 131 may be in the range from 1E15 cm−3 to 5E16 cm−3. The first main structure 130 may include further doped regions, for example field stop zones, barrier zones and/or current spread zones of the conductivity type of the drift portion 131, or counter-doped regions.

The drift portion 131 may directly adjoin the heavily doped contact layer 139 or a buffer layer forming a unipolar junction with the drift portion 131 may be directly between the drift portion 131 and the heavily doped contact layer 139, wherein a vertical extension of the buffer layer may be approximately 1 μm and a mean dopant concentration in the buffer layer may be in a range from 3E17 $cm^{-3}$ to 1E18 $cm^{-3}$, by way of example. The buffer layer may contribute to shaping the electric field gradient in the first main structure 130.

The transistor cells TC are oriented along trench gate structures 150 that extend from the first surface 101 into the semiconductor body 100 such that mesa portions 190 of the semiconductor body 100 separate neighboring trench gate structures 150.

A longitudinal extension of the trench gate structures 150 along a first horizontal direction orthogonal to the cross-sectional plane is greater than a transverse extension along a second horizontal direction orthogonal to the first horizontal direction. The trench gate structures 150 may be long stripes extending from one side of a transistor cell region to an opposite side, wherein the length of the trench gate structures 150 may be up to several millimeters. According to other embodiments a plurality of separated trench gate structures 150 may be formed along a line extending from one side of the transistor cell region to the opposite side, or the trench gate structures 150 may form a grid with the mesa portions 190 formed in the meshes of the grid. At the bottom, the trench gate structures 150 may be rounded.

The trench gate structures 150 may be equally spaced, may have equal width, and may form a regular pattern, wherein a pitch (center-to-center distance) of the trench gate structures 150 may be in a range from 1 μm to 10 μm, e.g., from 2 μm to 5 μm. A vertical extension of the trench gate structures 150 may be in a range from 0.3 μm to 5 μm, e.g., in a range from 0.5 μm to 2 μm.

The trench gate structures 150 may be vertical to the first surface 101 or may taper with increasing distance to the first surface 101. For example, a taper angle of the trench gate structures 150 with respect to the vertical direction may be equal to the off-axis angle or may deviate from the off-axis angle by not more than ±1 degree such that at least a first, active mesa sidewall 191 of two opposite longitudinal mesa sidewalls 191, 192 is formed by a main crystal plane with high charge carrier mobility, e.g., a {11-20} crystal plane. A second, passive mesa sidewall 192 opposite to the first, active mesa sidewall 191 may be tilted to a main crystal plane by twice the off-axis angle α, e.g., by 4 degrees or more, for example, by about 8 degrees. The first, active mesa sidewall 191 and the second, passive mesa sidewall 192 are on opposite longitudinal-sides of the intermediate mesa portion 190 and directly adjoin two different, neighboring trench gate structures 150.

The trench gate structures 150 include a conductive gate electrode 155 which may include or consist of a heavily doped polycrystalline silicon layer and/or a metal-containing layer. The gate electrode 155 may be electrically connected to a gate metallization that forms or that is electrically connected or coupled to a gate terminal. A gate dielectric 159 separates the gate electrode 155 from the semiconductor body 100 along at least the first, active mesa sidewall 191. The gate dielectric 159 may include or consists of a silicon oxide layer 153.

The second main structure 120 includes source zones 110 formed in the mesa portions 190 and oriented to the front side. The source zones 110 may directly adjoin the first surface 101 and directly adjoin at least the first, active mesa sidewall 191 of the respective mesa portion 190.

The second main structure 120 further includes body regions 122 formed in the mesa portions 190, wherein the body regions 122 separate the source zones 110 from the first main structure 130, e.g., from the drift portion 131. The body regions 122 form first pn junctions pn1 with the first main structure 130 and second pn junctions pn2 with the source zones 110. First portions of the body regions 122 directly adjoin the first, active mesa sidewalls 191 and second portions of the body regions 122 directly adjoin to the second, passive mesa sidewalls 192, wherein a dopant concentration in the second portions may exceed the dopant concentration in the first portions. The body regions 122 may include shielding regions 125 locally increasing the vertical extension of the body regions 122 and overlapping a portion of the trench gate structures 150 oriented to the second, passive mesa sidewalls 192.

A minimum extension of the body regions 122 along the active mesa sidewalls 191 corresponds to a channel length of the transistor cells TC and may be in a range from 0.2 μm to 1.5 μm.

An interlayer dielectric 210 that may include one or more dielectric layers from silicon oxide, silicon nitride, silicon oxynitride, doped or undoped silicon glass, for example BSG (boron silicate glass), PSG (phosphorus silicate glass) or BPSG (boron phosphorus silicate glass) separates the gate electrode 155 from a first load electrode 310. Contact structures 315 extend through the interlayer dielectric 210 and electrically connect the first load electrode 310 with the body regions 122 and the source zones 110.

The first load electrode 310 may form or may be electrically connected to a source terminal S. A second load electrode 320 directly adjoining to the second surface 102 may form or may be electrically connected or coupled to a drain terminal D.

According to an embodiment, the transistor cells TC are n-channel FET cells with p-doped body regions 122, n-doped source zones 110 and n-doped drift portion 131. According to another embodiment, the transistor cells TC are p-channel FET cells with n-doped body regions 122, p-doped source zones 110 and p-doped drift portion 131.

The gate dielectric 159 capacitively couples portions of the body regions 122 with the gate electrode 155. When a potential at the gate electrode 155 exceeds or falls below a threshold voltage of the IGFET the electric field effects that the minority charge carriers in the body regions 122 form inversion channels along the gate dielectric 159, wherein the inversion channels connect the source zones 110 with the drift portion 131 and the IGFET turns on. In the on-state, a load current flows through the semiconductor body 100 approximately along the first, active mesa sidewalls 191 between the first and second load electrodes 310, 320.

At least one of the first and second load electrodes 310, 320 includes a metal contact structure 302 and interface particles 300 embedded between the semiconductor body 100 and the respective metal contact structure 302 along the second surface 102.

Figure 10:
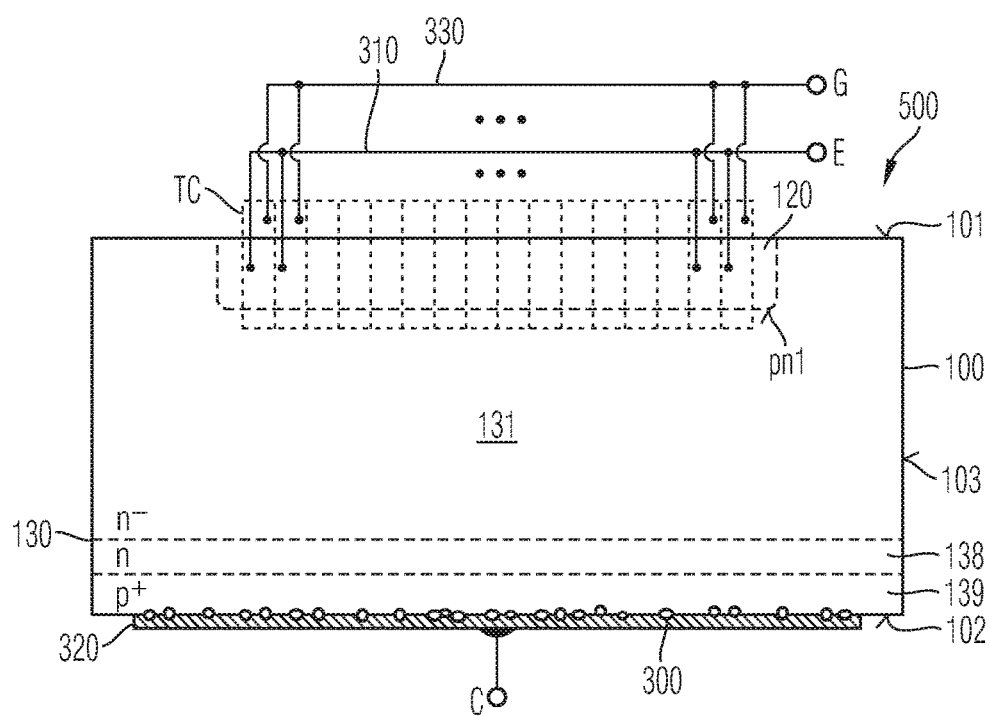
FIG. 10 is a schematic vertical cross-sectional view of a portion of an IGBT (insulated gate bipolar transistor) with a rear side metallization including interface particles according to a further embodiment.

In FIG. 10 the semiconductor device 500 is an IGBT which first main structure 130 includes a heavily doped contact layer 139 with a conductivity type which is complementary to the conductivity type of the drift portion 131 and which directly adjoins to a second load electrode 320 that forms or that is electrically connected to a collector terminal C. The source zones as well as the body regions 122 of the second main structure 120 form or may be electrically connected to an emitter terminal E.

The second load electrode 320 may include a metal contact structure 302 and interface particles 300 embedded between the metal contact structure 302 and the semiconductor body 100 along the second surface 102.

Figure 11:
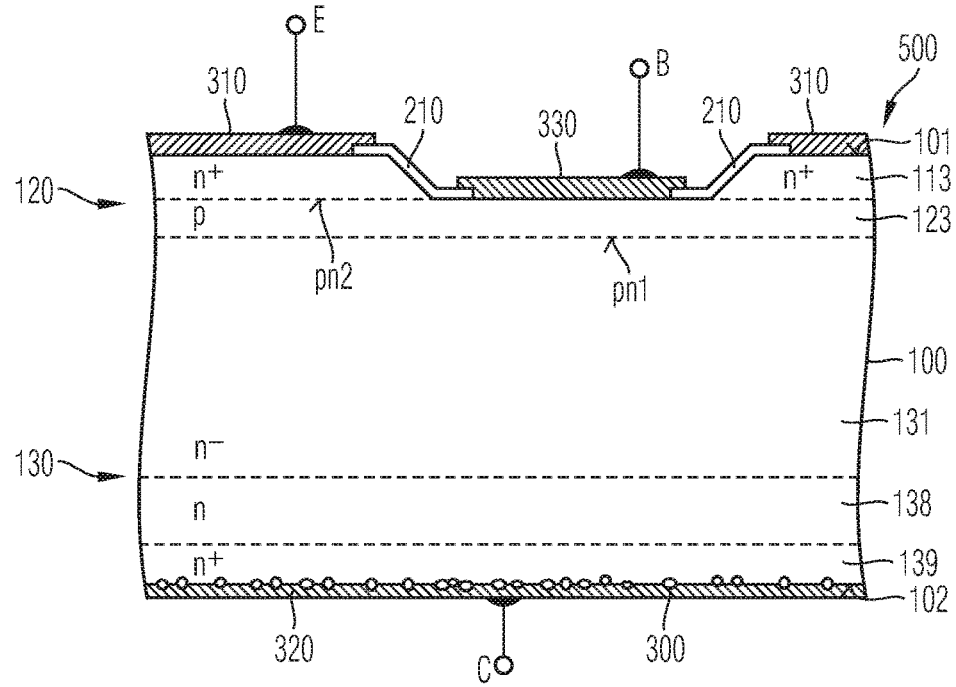
FIG. 11 is a schematic vertical cross-sectional view of a portion of a BJT (bipolar junction transistor) with a metallization including interface particles according to another embodiment.

In FIG. 11 the semiconductor device 500 is a BJT with the first main structure 130 forming a drift collector. The second main structure 120 includes a base region 123 that forms a first pn junction pn1 with the first main structure 130 and a second pn junction with an emitter zone 113. A first load electrode 310 directly adjoins to the emitter zone 113 and forms or is electrically connected to an emitter terminal E. A second load electrode 320 directly adjoins to the heavily doped contact layer 139 of the first main structure 130 and forms or is electrically connected to a collector terminal C.

At least one of the first and second load electrodes 310, 320 includes a metal contact structure 302 and interface particles 300 embedded along the interface between the semiconductor body 100 and the metal contact structure 302. In addition, a control electrode 330 directly adjoining the base region 123 may include a metal contact structure 302 and interface particles 300 embedded along the interface between the semiconductor body 100 and the metal contact structure 302.

Figure 12:
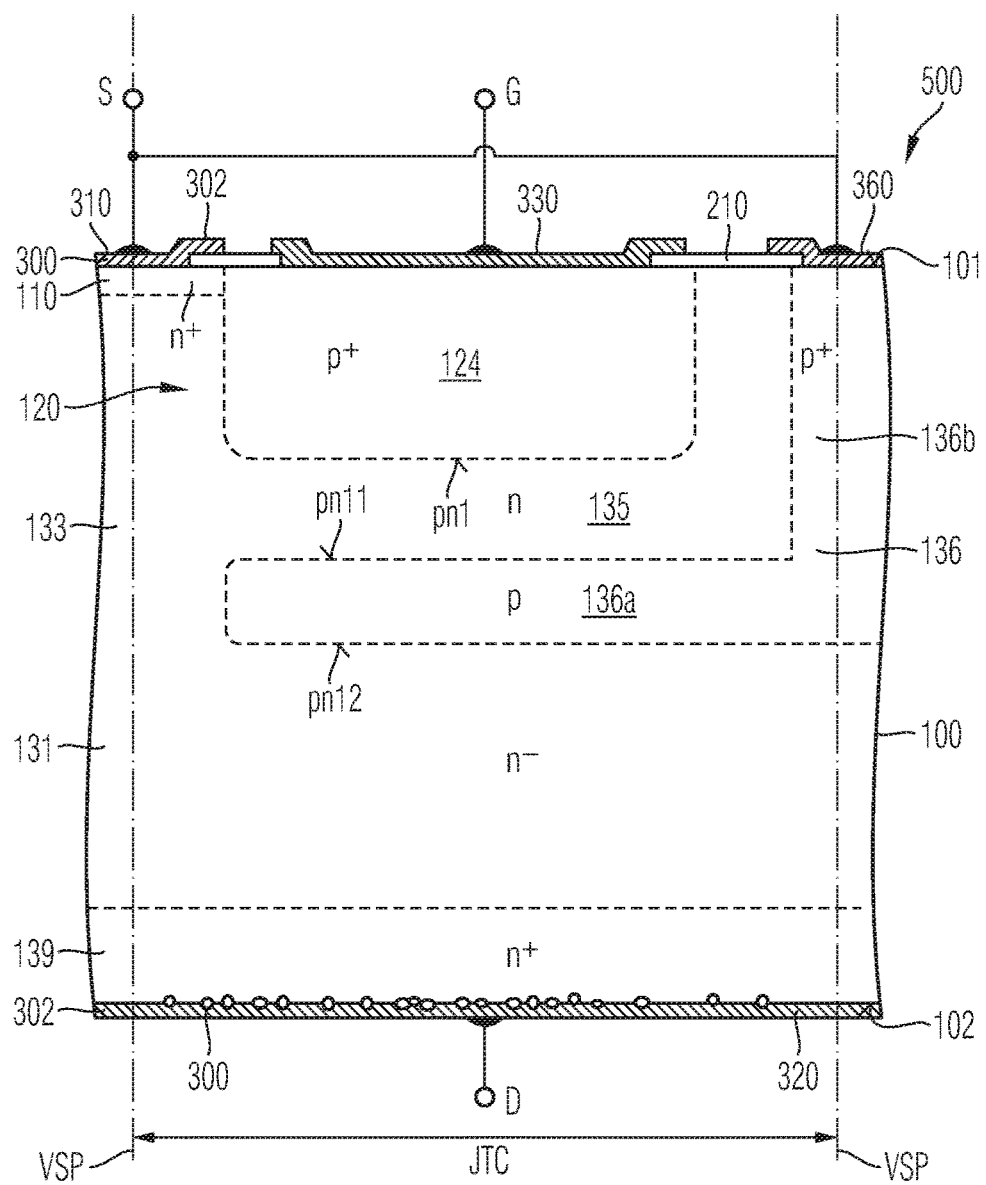
FIG. 12 is a schematic vertical cross-sectional view of a portion of a JFET (junction field effect transistor) with a metallization including interface particles according to another embodiment.

The semiconductor device 500 of FIG. 12 is a SiC-JFET based on a semiconductor body 100 from, for example, 6H—SiC, 15R—SiC, 4H—SiC or 3C—SiC as described above. The semiconductor body 100 includes a plurality of junction transistor cells JTC electrically connected in parallel to each other.

Each junction transistor cell JIG includes a heavily doped source zone 110 which may directly adjoin a first surface 101 at a front side of the semiconductor body 100. A first, load electrode 310 directly adjoins the source zones 110 of the junction transistor cells JTC and may form or may be electrically connected to a source terminal S.

A first main structure 130 directly adjoins a second surface 102 on the back of the semiconductor body 100. A second load electrode 320 directly adjoining to the second surface 102 may form or may be electrically connected to a drain terminal D of the SiC JFET.

The first main structure 130 forms a first pn junction pn1 with a second main structure 120 formed between the first surface 101 and the second main structure 120. The first main structure 130 may include a lightly doped drift portion 131, which may form a unipolar junction with a heavily doped contact layer 139 that directly adjoins the second surface 102 and that forms an ohmic contact with the second load electrode 320.

The first main structure 130 further includes a channel region 133 that connects the source zone 110 and the drift portion 131, wherein the channel region 133 has the same conductivity type as the source zone 110 and the drift portion 131 and a mean net dopant concentration in the channel region 133 is at most 10% of the mean net dopant concentration in the source zone 110.

The second main structure 120 may include or consist of a heavily doped gate region 124 that may extend from the first surface 101 into the semiconductor body 100. The gate region 124 has a conductivity type opposite to that of the channel region 133. The channel and gate regions 133, 124 form portions of the first pn junctions pn1 that extend along the vertical direction and/or along the lateral direction. A control electrode 330 electrically connected or coupled to a gate terminal G of the SiC JFET may directly adjoin to the gate region 124.

A voltage applied to the gate region 124 modulates the lateral extension of a depletion zone formed along a vertical portion of the first pn junction pn1 between the gate and channel regions 124, 133 and/or the vertical extension of a depletion zone formed along a horizontal portion of the first pn junction pn1. At a certain gate voltage, the depletion zone extends across the complete lateral cross-sectional area of the channel region 133, wherein the depletion zone pinches off and suppresses a current flow between the source zones 110 and the drift portion 131. The SiC JFET may be a normally-on type JFET with a current flow between the source zones 110 and the drift portion 131 when no voltage is applied between the control terminal G and the source terminal S.

The first main structure 130 may further include a shielding region 136, which has the conductivity type of the gate region 124 and which is formed at least in a portion of the vertical projection of the gate region 124 between the gate region 124 and the drift portion 131. The shielding region 136 forms a first auxiliary pn junction pn11 with the channel region 133 and a second auxiliary pn junction pn12 with the drift portion 131 and may include a lateral portion 136a extending parallel to the second surface 102. A vertical projection of the lateral portion 136a of the shielding region 136 may overlap with at least 40% of the gate region 124.

The shielding region 136 may or may not include a vertical portion 136b directly adjoining the lateral portion 136a and the first surface 101. A shielding electrode 360 may directly adjoin to the shielding region 136. The shielding electrode 360 may be electrically connected or coupled to the first load electrode 310, the control electrode 330, or to an auxiliary terminal of the SiC JFET. A separation region 135 of the conductivity type of the source zone 110 separates the gate region 124 and the shielding region 136.

According to the embodiment illustrated in FIG. 12, neighboring junctions transistor cells JTC may directly adjoin to each other in a way that they are symmetric with respect to a vertical separation plane VSP between them. According to other embodiments, neighboring junctions transistor cells JTC directly adjoin to each other in a way that they have the same orientation.

At least one of the first and second load electrodes 310, 320 includes a metal contact structure 302 and interface particles 300 embedded along the interface between the semiconductor body 100 and the metal contact structure 302. In addition, the control electrode 330 and/or the shielding electrode 360 may include a metal contact structure 302 and interface particles 300 embedded along the interface between the semiconductor body 100 and the metal contact structure 302.

FIGS. 13A to 13G concern the formation of a contact structure including interface particles 300 as described above on a device rear side.

Figure 13A:
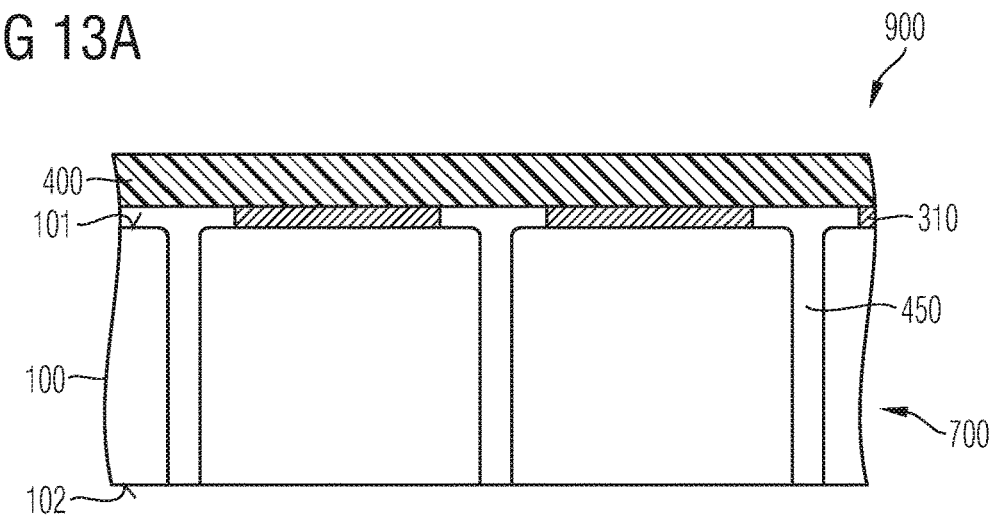
FIG. 13A is a schematic vertical cross-sectional view of a portion of a wafer composite including a silicon carbide body for illustrating a method of manufacturing semiconductor devices with interface particles according to an embodiment using a nickel oximate spray, after applying a carrier foil at device front side.

FIG. 13A shows a wafer composite 900 including a silicon carbide body 700, which is a preprocessed silicon carbide wafer. In device regions of the silicon carbide body 700 the functional elements at a front side of power semiconductor devices such as power semiconductor diodes, IGFETs, JFFTs, BJTs or IGBTs are formed, for example, the anode regions of semiconductor diodes or the transistor cells of JFETs, BJTs, IGFETs and IGBTs. The device regions the silicon carbide body 700 form a plurality of semiconductor bodies 100 for a corresponding number of semiconductor devices. On a first surface 101 of each semiconductor body 100 a first metallization is formed that includes at least a first load electrode 310. A carrier foil 400 is reversibly attached, for example, adhesion-bonded onto the first metallization including the first load electrodes 310.

The illustrated embodiment refers to a DBG (dicing before grinding) process in which the semiconductor bodies 100 are separated by an etch process before a vertical extension of the semiconductor bodies 100 is reduced to its final value. The DBG process may include, e.g., an etch process forming a grid-like dicing trench separating the device regions and a fill process at least partially filling the dicing trench with an auxiliary material to form a separation structure 450 that at least partially fills the dicing trench. According to other embodiments, neighboring semiconductor bodies 100 may directly adjoin to each other.

The silicon carbide body 700 is then thinned from the device rear side. For example, a grinding process, a polishing process or a process combining grinding and polishing removes a portion of the silicon carbide body 700.

Figure 13B:
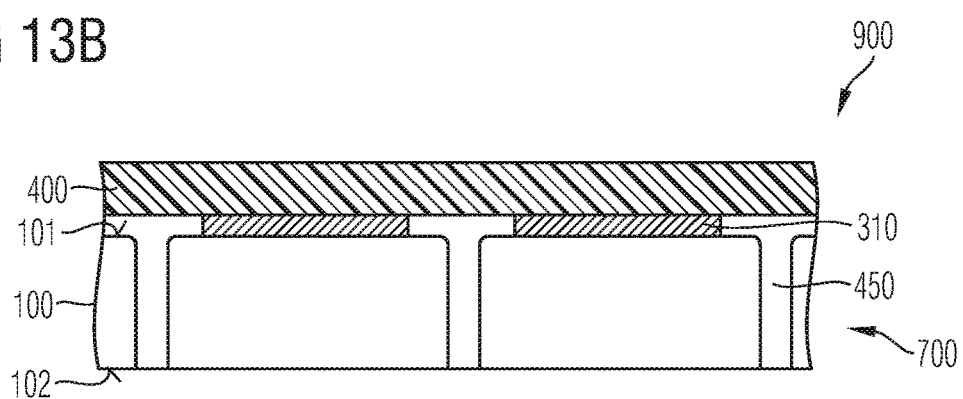
FIG. 13B is a schematic vertical cross-sectional view of the wafer composite of FIG. 13A, after recessing the silicon carbide body from a device rear side.

FIG. 13B shows the thinned silicon carbide body 700. The wafer composite 900 is then turned upside down and a nickel oximate may be sprayed on a process surface 701 of the silicon carbide body 700, wherein the process surface 701 exposes sections of second surfaces 102 at the rear side of the semiconductor bodies 100 and, in case of a DBG approach, exposed portions of the separation structure 450. For example, between 0.5 ml and 5 ml of a solution 390 including about 10 mg nickel oximate dissolved in 10 ml isopropanol is sprayed onto the process surface 701 in several separated runs.

Figure 13C:
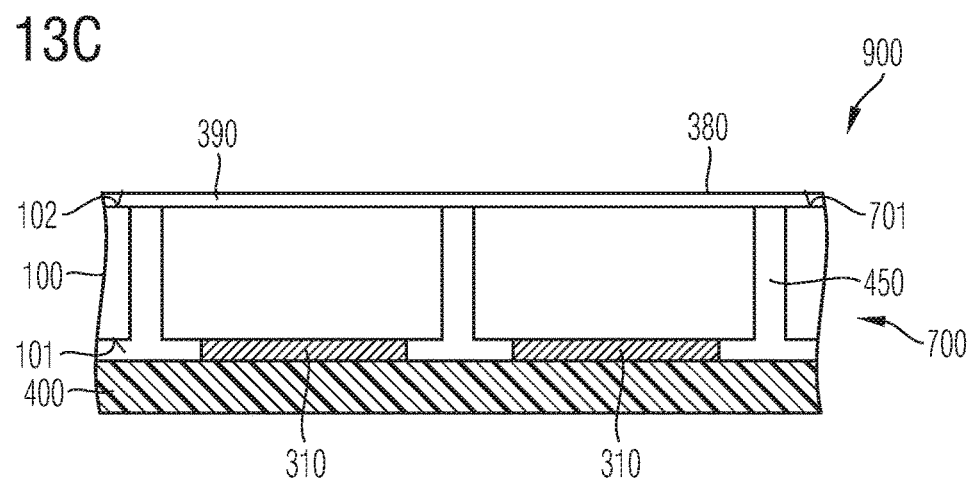
FIG. 13C is a schematic vertical cross-sectional view of the wafer composite of FIG. 13B, after applying nickel oximate onto a process surface on the device rear side.

FIG. 13C shows a precursor structure 380 including the nickel oximate solution 390, which may be solid or highly viscous at 25° C. ambient temperature and ambient pressure. The carrier foil 400 may be removed.

Figure 13D:
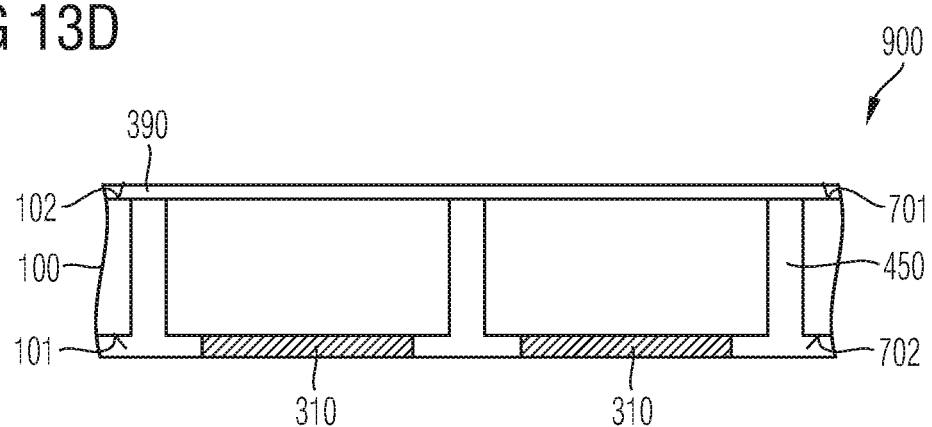
FIG. 13D is a schematic vertical cross-sectional view of the wafer composite of FIG. 13C, after removing the carrier foil.

FIG. 13D shows the wafer composite 900 after removal of the carrier foil 400. Before or after removal of the carrier foil 400, the wafer composite 900 may be subjected to a heat treatment at a temperature in a range from 150° C. to 250° C. to bake the precursor structure 380 containing the nickel oximate solution 390. The heat treatment decomposes the solvent into gaseous decomposition products. The nickel oximate may form a complete or a non-complete and non-continuous starting layer 350 including isolated portions 356.

Figure 13E:
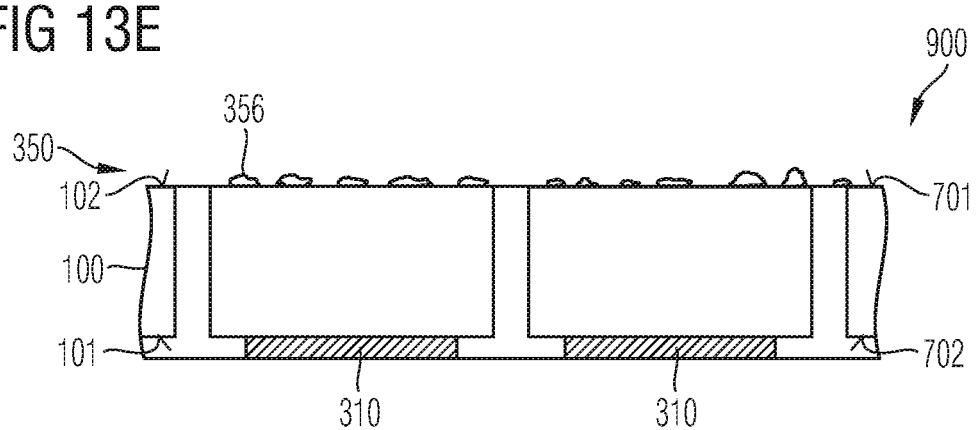
FIG. 13E is a schematic vertical cross-sectional view of the wafer composite of FIG. 13D, after a low temperature bake of the nickel oximate.

FIG. 13E shows the non-complete starting layer 350 on the process surface 701. A laser anneal heats a portion of the silicon carbide body 700 along the process surface 701 at an energy density between 3.8 Jcm$^{-2}$ and 4.5 Jcm$^{-2}$.

Figure 13F:
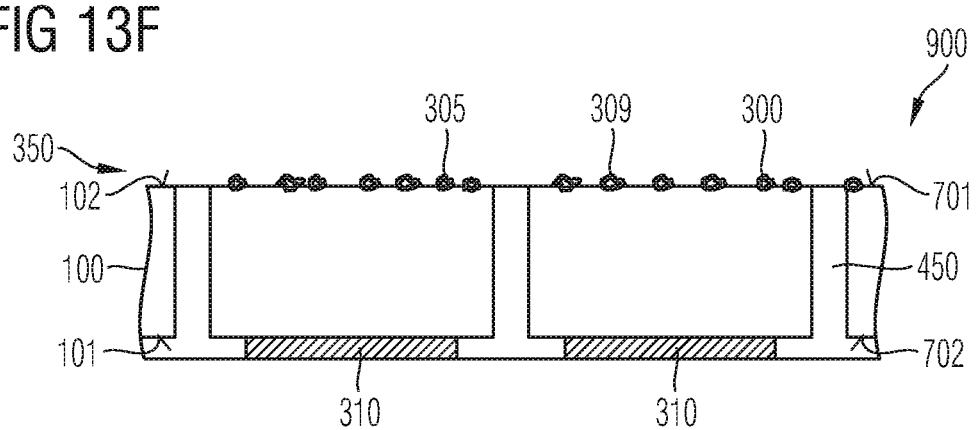
FIG. 13F is a schematic vertical cross-sectional view of the wafer composite of FIG. 13E, after a laser anneal forming interface particles.

As shown in FIG. 13F the laser anneal transforms the nickel oxide of the isolated portions 356 of the starting layer 350 of FIG. 13E into interface particles 300 that include a silicide kernel 305 and a carbon cover 309. The interface particles 300 are formed at the second surface 102 of the semiconductor bodies 100. A metal may be deposited.

Figure 13G:
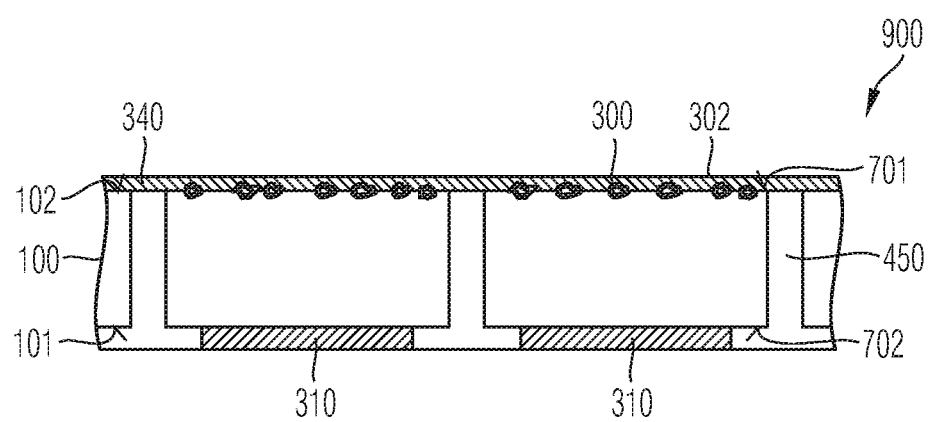
FIG. 13G is a schematic vertical cross-sectional view of the wafer composite of FIG. 13F, after forming a metal contact layer.

FIG. 13G shows a metal contact structure 302 embedding the interface particles 300 between the metal contact structure 302 and the semiconductor bodies 100 and forming a continuous metal layer 311 on the process surface 701 of the silicon carbide body 700. Then the semiconductor bodies 100 may be singulated, e.g., by adhering the wafer composite 900 onto a pick-up tape and then selectively removing the separation structure 450.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming, on a process surface of a silicon carbide body, a starting layer from a material comprising a silicide-forming metal; and
   forming, from the starting layer and a portion of the silicon carbide body, isolated interface particles comprising a silicide kernel and a carbon cover, wherein a connection portion of the process surface between the isolated interface particles is exposed.

2. The method of claim 1, further comprising:
   forming a metal contact layer directly on the connection portion of the process surface, wherein the interface particles are embedded between the metal contact layer and the silicon carbide body.

3. The method of claim 1, wherein the starting layer comprises at least one opening exposing an uncoated portion of the process surface.

4. The method of claim 1, wherein the starting layer completely covers the process surface, and wherein material, configuration and thickness of the starting layer are selected to expose the connection portion during the formation of the interface particles.

5. The method of claim 1, wherein the silicide-forming metal is one of nickel, tungsten, vanadium, titanium, cobalt and iron.

6. The method of claim 1, wherein the starting layer comprises at least one of a metal, a metal oxide and a metal-organic material.

7. The method of claim 1, wherein the starting layer is formed by a heat treatment of a solution comprising a solute containing the silicide-forming metal.

8. The method of claim 7, wherein the solute comprises a metal compound containing a metal complex with a central metal atom and at least one organic ligand.

9. The method of claim 7, wherein the solution comprises nickel oximate and the starting layer is a nickel oxide layer.

10. The method of claim 1, wherein the starting layer comprises metal particles.

11. The method of claim 10, wherein forming the starting layer comprises:
    removing a matrix material containing the metal particles.

12. The method of claim 11, wherein the matrix material is a liquid in which the metal particles are dispersed, and wherein the heat treatment vaporizes or gasifies the matrix material.

13. The method of claim 1, wherein a thickness of the starting layer is in a range from 5 nm to 500 nm.

14. The method of claim 1, wherein the starting layer is at least one of amorphous and nanocrystalline or comprises nanoparticles.

15. The method of claim 1, wherein forming the interface particles comprises a laser anneal.

* * * * *